US009721984B2

(12) United States Patent
Cheng et al.

(10) Patent No.: US 9,721,984 B2
(45) Date of Patent: Aug. 1, 2017

(54) IMAGE SENSOR MANUFACTURING METHODS

(75) Inventors: Mu-Han Cheng, Tainan (TW); Kuo-Hsiu Wei, Tainan (TW); Kei-Wei Chen, Tainan (TW); Ying-Lang Wang, Tien-Chung Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 395 days.

(21) Appl. No.: 13/445,766

(22) Filed: Apr. 12, 2012

(65) Prior Publication Data

US 2013/0273686 A1 Oct. 17, 2013

(51) Int. Cl.
*H01L 27/146* (2006.01)

(52) U.S. Cl.
CPC .... *H01L 27/14623* (2013.01); *H01L 27/1464* (2013.01); *H01L 27/14687* (2013.01)

(58) Field of Classification Search
USPC .......... 438/70; 257/457, 460, E23.015, 459, 257/E21.614
See application file for complete search history.

(56) References Cited

U.S. PATENT DOCUMENTS

| | | | |
|---|---|---|---|
| 5,272,117 A * | 12/1993 | Roth et al. ...................... 438/14 |
| 5,416,324 A * | 5/1995 | Chun .......................... 250/341.3 |
| 6,441,297 B1 * | 8/2002 | Keller et al. .................. 136/249 |
| 6,998,719 B2 * | 2/2006 | Campbell et al. ............ 257/786 |
| 8,558,338 B2 * | 10/2013 | Tsuji .................. H01L 27/14621 257/432 |
| 9,281,333 B2 * | 3/2016 | Lin .................... H01L 27/14603 |
| 2004/0159933 A1 * | 8/2004 | Sunohara et al. ............. 257/700 |
| 2006/0231130 A1 * | 10/2006 | Sharps et al. ................. 136/243 |
| 2008/0061390 A1 * | 3/2008 | Swain et al. .................. 257/432 |
| 2009/0020838 A1 * | 1/2009 | Lin .................... H01L 27/14621 257/432 |
| 2009/0280596 A1 * | 11/2009 | Akiyama ........................ 438/70 |
| 2010/0053407 A1 * | 3/2010 | Crisp ................ H01L 27/14618 348/311 |
| 2010/0110271 A1 * | 5/2010 | Yanagita et al. .............. 348/340 |
| 2010/0201834 A1 * | 8/2010 | Maruyama ........ H01L 27/14627 348/222.1 |
| 2010/0230735 A1 * | 9/2010 | Zhu ................................ 257/301 |
| 2010/0244173 A1 * | 9/2010 | Wang et al. .................. 257/435 |

(Continued)

FOREIGN PATENT DOCUMENTS

| | | |
|---|---|---|
| TW | 442363 B | 6/2001 |
| TW | 508819 | 11/2002 |
| TW | 200727465 | 7/2007 |

OTHER PUBLICATIONS

Wikipedia, "Back-illuminated sensor," http://en.wikipedia.org/wiki/Back-illuminated_sensor, Mar. 10, 2012, 3 pages.

*Primary Examiner* — Benjamin Sandvik
(74) *Attorney, Agent, or Firm* — Slater Matsil, LLP (57) ABSTRACT

Semiconductor devices and back side illumination (BSI) sensor manufacturing methods are disclosed. In one embodiment, a method of manufacturing a semiconductor device includes providing a workpiece and forming an integrated circuit on a front side of the workpiece. A grid of a conductive material is formed on a back side of the workpiece using a damascene process.

20 Claims, 7 Drawing Sheets

(56) References Cited

U.S. PATENT DOCUMENTS

| | | | |
|---|---|---|---|
| 2010/0245637 A1* | 9/2010 | Itonaga | H01L 27/14621 348/273 |
| 2011/0037883 A1* | 2/2011 | Lee | H01L 27/14623 348/273 |
| 2011/0108938 A1* | 5/2011 | Nozaki | H01L 27/14621 257/432 |
| 2012/0147208 A1* | 6/2012 | Otsuka | H01L 27/14621 348/222.1 |
| 2012/0313208 A1* | 12/2012 | Kim | H01L 27/14634 257/435 |

* cited by examiner

IMAGE SENSOR MANUFACTURING METHODS

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

Integrated circuit dies are formed on a front side of semiconductor wafers. The integrated circuit dies may comprise various electronic components, such as transistors, diodes, resistors, capacitors, and other devices. The integrated circuit dies may comprise various functions, such as logic memory, processors, and/or other functions.

Complementary metal oxide semiconductor (CMOS) image sensors are used in cameras, cell phones, and other devices for capturing images. Back side illumination (BSI) image sensors are CMOS image sensors in which light enters from a back side of a substrate, rather than the front side. BSI sensors are capable of capturing more of an image signal than front side illumination sensors due to a reduced reflection of light.

Improved methods of manufacturing BSI image sensors are needed in the art.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to manufacturing methods for semiconductor devices. Novel methods of improving planarity of back side surfaces of semiconductor devices by forming a metal grid on the back side of a workpiece using damascene processes will be described herein.

FIGS. 1 through 5 show cross-sectional views of a method of forming a metal grid 110 (see FIG. 4) on a back side 108 of the workpiece 102 at various stages of manufacturing in accordance with an embodiment. To manufacture a semiconductor device 100, first, the workpiece 102 is provided. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

A plurality of integrated circuits 104, shown in phantom in FIGS. 1 through 5, is formed on a front side 106 of the workpiece 102. The front side 106 of the workpiece 102 comprises a bottom side of the workpiece 102 in the view shown in FIG. 1. The integrated circuits 104 on the workpiece 102 will later be singulated into individual dies, not shown in the drawings. The workpiece 102 includes the back side 108 that is opposite the front side 106. The back side 108 of the workpiece 102 comprises a top side of the workpiece 102 in FIG. 1.

The metal grid 110 may be formed before, or after, the integrated circuits 104 are formed on the front side of the workpiece 102. Portions of the integrated circuits 104 may be formed on the front side 106 of the workpiece 102, and the metal grid 110 may be formed on the back side 108 of the workpiece 102, and then the remainder of the integrated circuits 104 may be formed on the front side 106 of the workpiece 102 in other embodiments.

The integrated circuits 104 formed on the front side 106 of the workpiece 102 are not shown in detail in the figures. The integrated circuits 104 may comprise electronic components such as transistors, diodes, photodiodes, resistors, capacitors, inductors, conductive lines and vias, and/or other devices. The integrated circuits 104 may comprise one or more functions, such as logic, memory, processors, and/or other functions and/or circuitry. The integrated circuits 104 comprise portions of a BSI sensor, such as pixel units and wiring layers, in some embodiments, to be described further herein.

Figure 1:
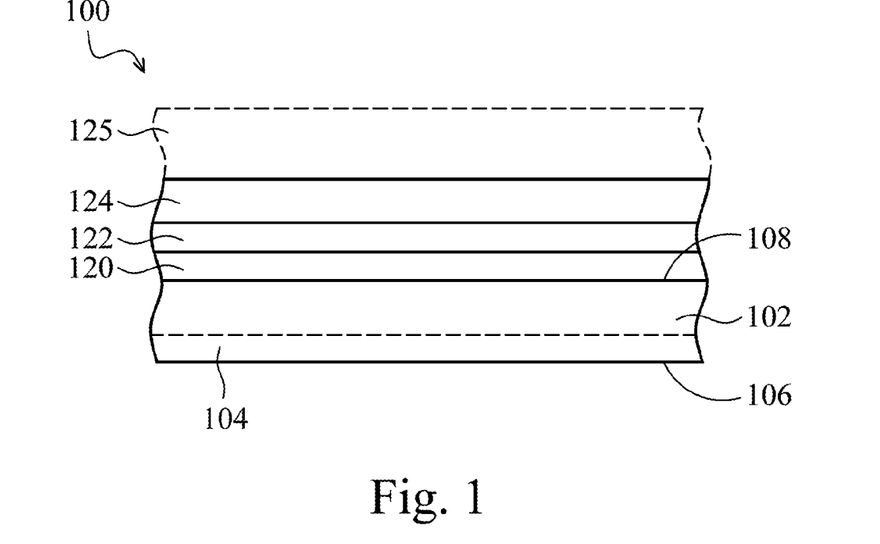
FIGS. 1 through 5 show cross-sectional views of a method of forming a metal grid on a back side of a workpiece at various stages of manufacturing in accordance with an embodiment.

An anti-reflective coating (ARC) 120 is formed on the surface of the back side 108 of the workpiece 102 in some embodiments, as shown in FIG. 1. The ARC 120 comprises a material that dampens reflected light from surfaces and material layers in subsequent photolithography processes. The ARC 120 may comprise a thickness of about 0.1 μm to 0.5 μm of a silicon carbon material, as an example, although alternatively, the ARC 120 may comprise other materials and dimensions.

An insulating material 122 is formed over the ARC 120 in some embodiments, also shown in FIG. 1. The insulating material 122 may comprise a buffer oxide and is also referred to herein (e.g., in the claims) as a third insulating material. The insulating material 122 may comprise about 0.5 µm to 1 µm of an oxide such as silicon dioxide, for example. The insulating material 122 may also comprise other insulators, such as SiOx and/or SiN, as examples. Alternatively, the insulating material 122 may comprise other materials and dimensions.

The ARC 120 and the insulating material 122 are optional and may not be included in some embodiments.

An insulating material 124 is deposited over the back side 108 of the workpiece 102. For example, the insulating material 124 is formed over the insulating material 122, if the insulating material 122 is included in the structure, as shown in FIG. 1. The insulating material 124 is also referred to herein as a first insulating material. The insulating material 124 comprises a material layer in which the metal grid 110 will be formed using a damascene process. The insulating material 124 comprises about 3,000 Angstroms or less of an oxide material such as silicon dioxide. The insulating material 124 may comprise silicon dioxide, silicon nitride, or multiple layers or combinations thereof, as examples. The insulating material 124 may be formed using chemical vapor deposition (CVD), physical vapor deposition (PVD), or other methods. Alternatively, the insulating material 124 may comprise other materials and dimensions and may be formed using other methods. A layer of photoresist 125, shown in phantom in FIG. 1, may optionally be formed over the insulating material 124.

Figure 2:
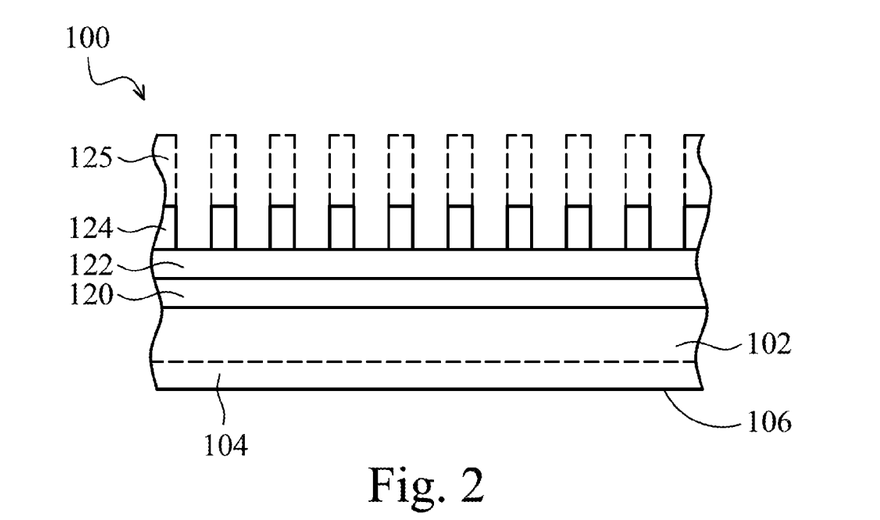

The insulating material 124 is then patterned, as shown in FIG. 2. The insulating material 124 may be patterned in some embodiments by first patterning the layer of photoresist 125 (also shown in phantom in FIG. 2) using lithography, and transferring the pattern of the photoresist 125 to the insulating material 124 using the photoresist 125 as an etch mask while portions of the insulating material 124 are etched away. The layer of photoresist 125 may be exposed to energy through or reflected from a lithography mask (not shown), and either exposed or unexposed portions of the layer of photoresist 125 are then etched away, depending on whether a positive or negative photoresist is used. The patterned layer of photoresist 125 is then used as the etch mask to pattern the insulating material 124 in an etch process. The layer of photoresist 125 is then removed.

In other embodiments, the photoresist 125 is not used, and the insulating material 124 is directly patterned. The insulating material 124 may comprise a photosensitive material that is adapted to be directly patterned in these embodiments, for example. The insulating material 124 may be directly patterned using a laser beam or other energy source, as an example.

Figure 3:
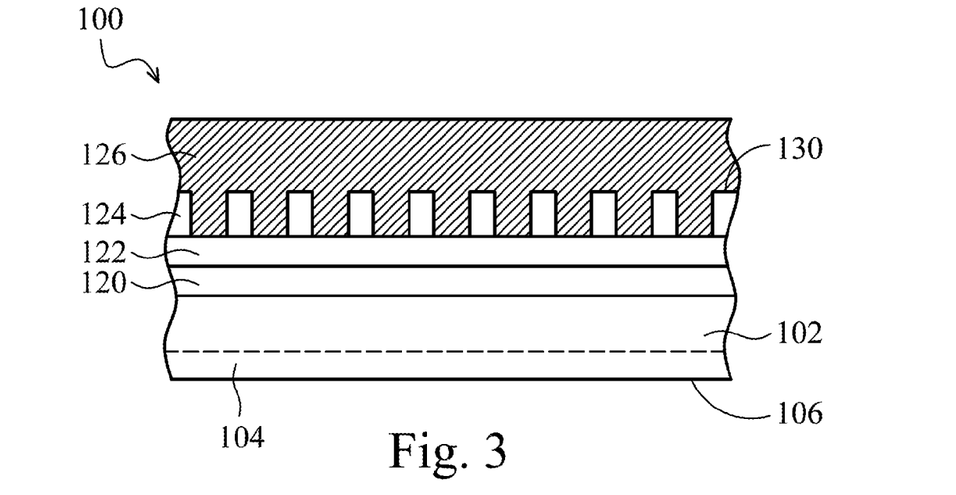

The pattern in the insulating material 124 comprises a plurality of patterns having a grid shape. The patterns in the insulating material 124 are filled with a conductive material, forming a grid of the conductive material. To fill the patterns in the insulating material 124, a conductive material 126 shown in FIG. 3 is deposited over the patterned insulating material 124, filling the patterns in the insulating material 124 and covering the top surface 130 of the insulating material 124. The conductive material 126 comprises a metal. The conductive material 126 comprises tungsten (W) in some embodiments, although alternatively, the conductive material 126 may comprise W, aluminum (Al), copper (Cu), other metals, or multiple layers or combinations thereof. The conductive material 126 may be formed using PVD, sputtering, or other methods.

The excess conductive material 126 is removed from over the top surface 130 of the insulating material 124 using a chemical-mechanical polishing (CMP) process. An endpoint detection method may be used to monitor and detect when the top surface 130 of the insulating material 124 has been reached in some embodiments. An endpoint may be established that is a component of the insulating material 124, for example. If the insulating material 124 comprises an oxide, the endpoint may comprise oxygen, as an example. If the insulating material 124 comprises silicon dioxide, the endpoint may comprise silicon, silicon dioxide, or oxygen, as another example. Removal of the metal 126 is discontinued (i.e., the CMP process is stopped) when the endpoint is detected, in some embodiments. A slurry of the CMP process may be monitored to detect whether the endpoint has been reached, for example. The endpoint detection method advantageously provides improved control of the CMP process, providing a more uniform top surface 130 of the insulating material 124 and grid 110 after the CMP process. The more uniform top surface 130 of the insulating material 124 and grid 110 advantageously causes subsequently deposited material layers to be more uniform.

Figure 4:
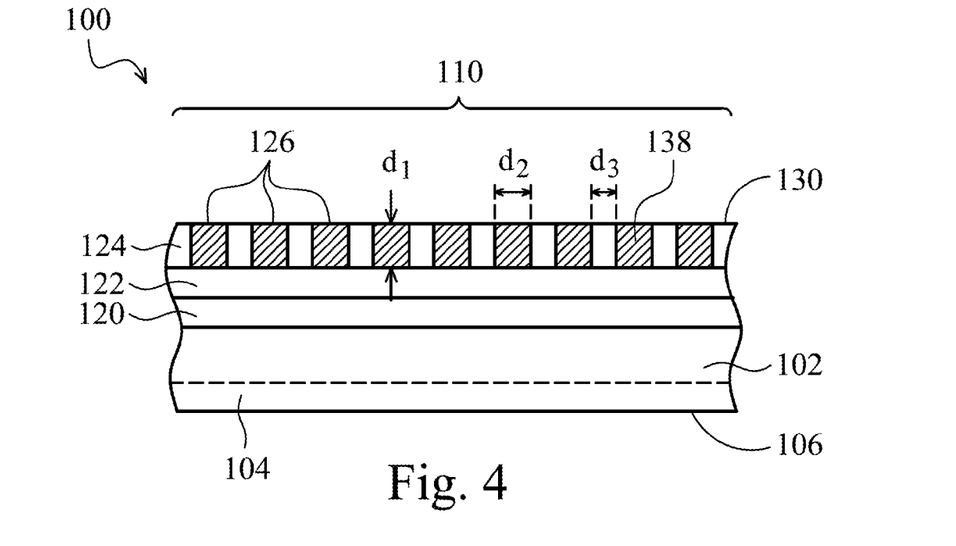

FIG. 4 shows a cross-sectional view of the semiconductor device 100 after the CMP process. The grid 110 comprises the conductive material 126 left remaining in the patterns of the insulating material 124. The grid 110 comprises a plurality of members 138 (also referred to herein as members 138a and 138b; see the bottom view of the grid 110 in FIG. 7) of the conductive material 126. The plurality of members 138, 138a, and 138b of the conductive material 126 comprise a thickness comprising dimension $d_1$ (see FIG. 4) in a cross-sectional view of the workpiece 102 of about 3,000 Angstroms or less in some embodiments. The members 138, 138a, and 138b comprise a thickness of about 2,000 Angstroms in other embodiments. The members 138, 138a, and 138b comprise a thickness substantially the same as a thickness of the insulating material 124, for example. The members 138, 138a, and 138b also comprise a width or thickness comprising dimension $d_2$ in a bottom view and cross-sectional of the workpiece 102 of about 130 nm to 300 nm. The members 138, 138a, and 138b may be spaced apart by a dimension $d_3$ that comprises about 130 nm to 300 nm. Dimensions $d_2$ and $d_3$ may be substantially the same in some embodiments. Alternatively, dimensions $d_2$ and $d_3$ may be different. Alternatively, dimensions $d_1$, $d_2$, and $d_3$ of the members 138, 138a, and 138b of the metal grid 110 may comprise other values.

Figure 5:
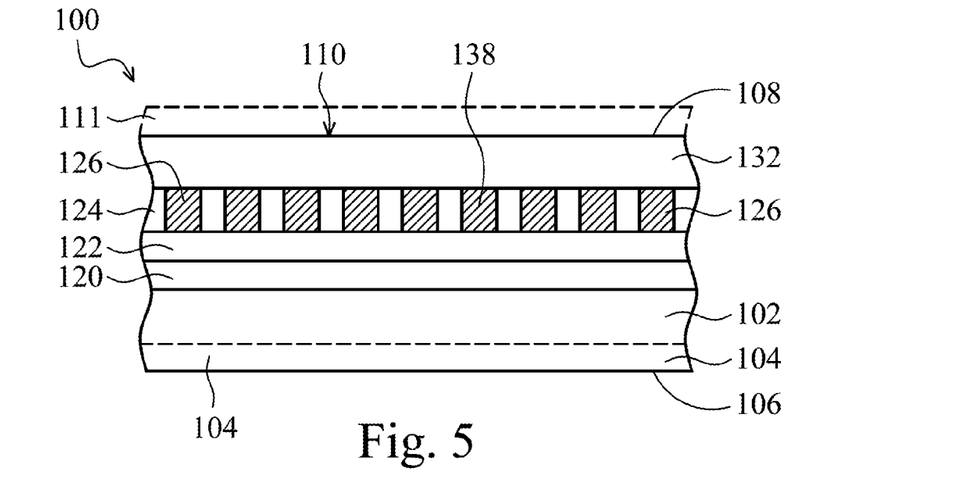

After the metal grid 110 is formed, an insulating material 132 is formed over the grid 110 and the insulating material 124, as shown in FIG. 5. The insulating material 132 is also referred to herein as a second insulating material. The insulating material 132 comprises a passivation oxide in some embodiments that is adapted to prevent oxidation of the metal grid 110. The insulating material 132 may comprise about 50 nm to 200 nm of silicon dioxide or other materials, as examples, although alternatively, the insulating material 132 may comprise other materials and dimensions.

Advantageously, the grid 110 improves a uniformity of the insulating material 132. Because the grid 110 comprises members 138, 138a, and 138b having a uniform thickness comprising dimension $d_1$ across a surface of the workpiece 102, the thickness of the insulating material 132 is also uniform across the surface of the back side 108 of the workpiece 102. This is advantageous in applications where uniformity of the insulating material 132 is important to the semiconductor device 100 design and/or manufacturing process. The grid 110 has a top surface that is substantially coplanar with the top surface 130 of the first insulating material 124, providing improved planarity. The second insulating material 132 may be formed by chemical vapor deposition (CVD) or other methods, and the improved planarity of the first insulating material 124 and grid 110 beneath the second insulating material 132 results in a well-controlled, uniform deposition process for the second insulating material 132, improving the planarity of the second insulating material 132.

For example, in embodiments wherein the insulating material 132 comprises a passivation oxide, it may be important for light to be absorbed evenly over the back side 108 of the workpiece 102. As one example, in embodiments wherein the integrated circuit 104 is formed on the front side 106 of the workpiece 102 after the grid 110 is formed, it may be important for lithography processes for the front side 106 of the workpiece 102 for the passivation oxide 132 to comprise a uniform thickness on the back side 108 of the workpiece 102, because light passes through the workpiece 102 to the back side 108 from the front side 106 during the lithography processes. A uniform coating of the insulating material 132 on the workpiece 102 back side 108 provided by embodiments of the present disclosure achieves uniform light and/or energy absorption across the back side 108 of the workpiece 102, advantageously.

As another example, a cap color photoresist film 111, shown in phantom in FIG. 5, may be formed over the passivation oxide 132 in some embodiments. The more uniform passivation oxide 132 results in a more uniform cap color photoresist film 111, advantageously. The film 111 functions to separate light transmitted to a red-green-blue (RGB) original element when utilized as a back side illumination image sensor, as an example. The film 111 may comprise a color filter material in some embodiments, to be described further herein.

After the grid 110 is formed and after the insulating material 132 and the optional film 111 are formed over the grid 110, an integrated circuit 104 or at least a portion of an integrated circuit 104 may be formed on the front side 106 of the workpiece 102, as shown in phantom in FIG. 5. Alternatively, the integrated circuit 104 or at least a portion thereof may be formed before the grid 110 is formed and/or before the second insulating material 132 is formed.

Figure 6:
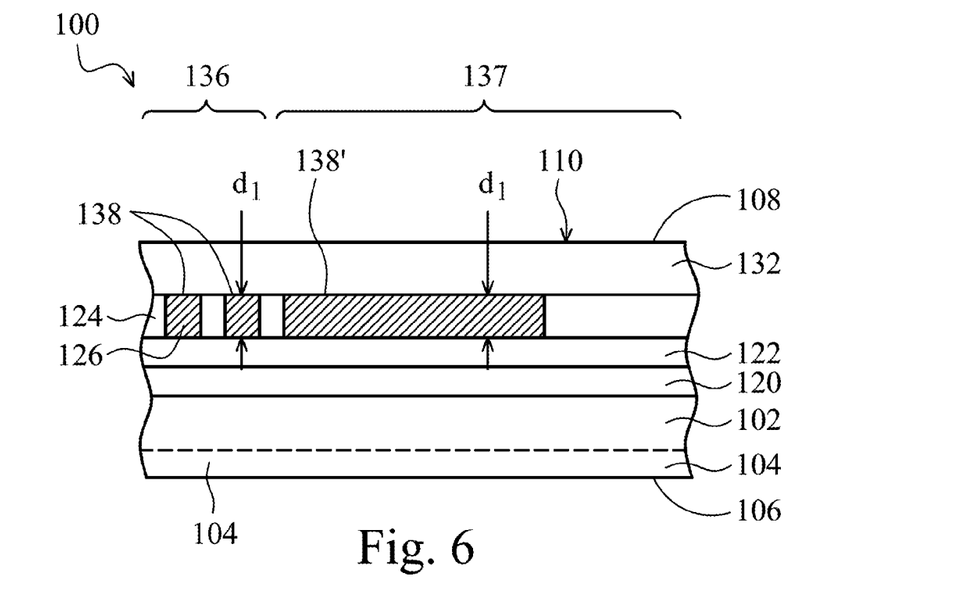
FIG. 6 is a cross-sectional view of a metal grid in accordance with another embodiment.

FIG. 6 is a cross-sectional view of a metal grid 110 in accordance with another embodiment. The back side 108 of the workpiece 102 includes a first region 136 and a second region 137. The first region 136 includes regions wherein the grid 110 includes closely-spaced members 138 having a narrow width. The second region 137 includes regions where the grid 110 includes widely-spaced members 138' having a greater width than the width of members 138 in the first region 136. The members 138 and 138' of the metal grid 110 may not comprise the same widths and may be spaced apart by different dimensions in accordance with some embodiments. However, the members 138 and 138' in the two regions 136 and 137 comprise substantially a same thickness $d_1$ across the surface of the back side 108 in accordance with embodiments of the present disclosure, to improve uniformity and planarity of the surface of the back side 108.

The grid 110 may be formed in some regions 136 of the workpiece 102 but not in other regions 137 of the workpiece 102, as another example, also shown in FIG. 6 at the right edge of the drawing. The grid region 136 may comprise a dimension of about 4 mm to 6 mm disposed in each integrated circuit or die 104 center, as an example, to be shown and described further herein with reference to FIGS. 9 and 10.

Figure 7:
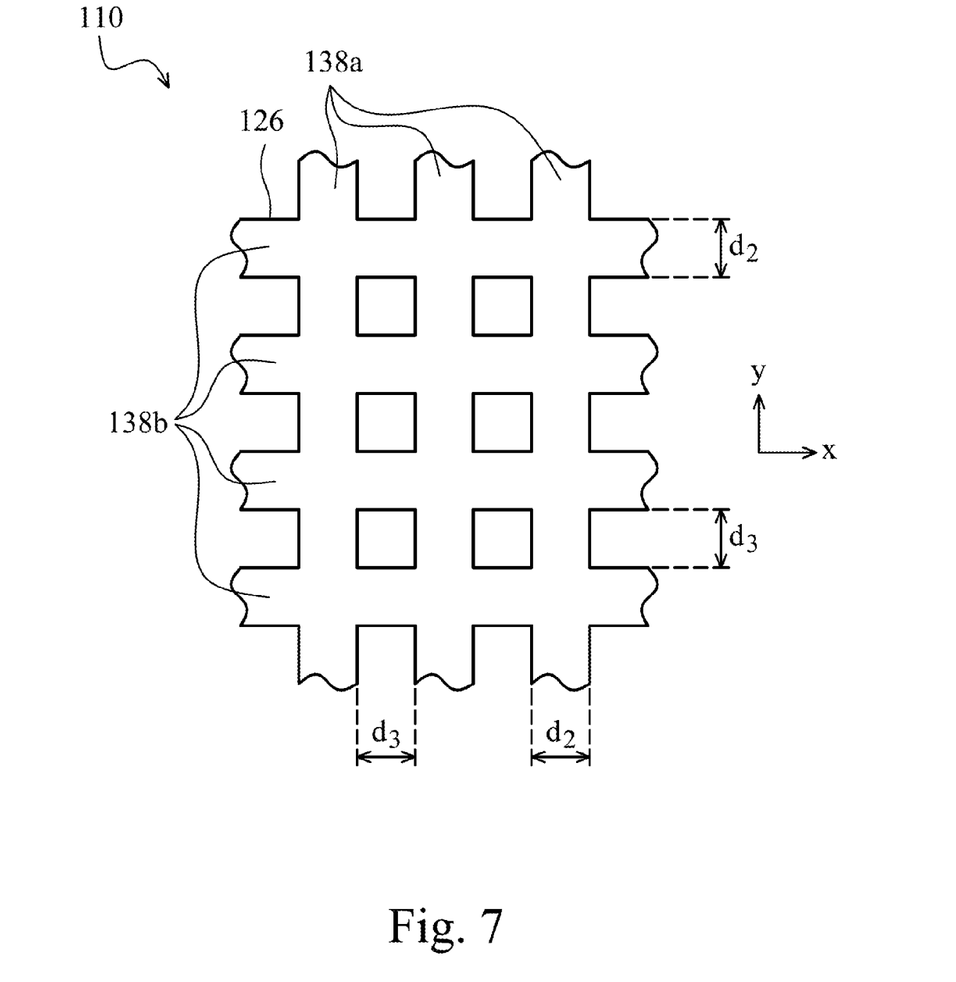
FIG. 7 is a bottom view of a portion of the metal grid in accordance with an embodiment.

FIG. 7 is a bottom view of a portion of the metal grid 110. The grid 110 comprises a plurality of members 138a and 138b of the conductive material 126 that extend lengthwise in an x direction and a y direction in a bottom view of the workpiece 102. Members 138a extend in a y direction and members 138b extend in an x direction in the view shown.

Figure 8:
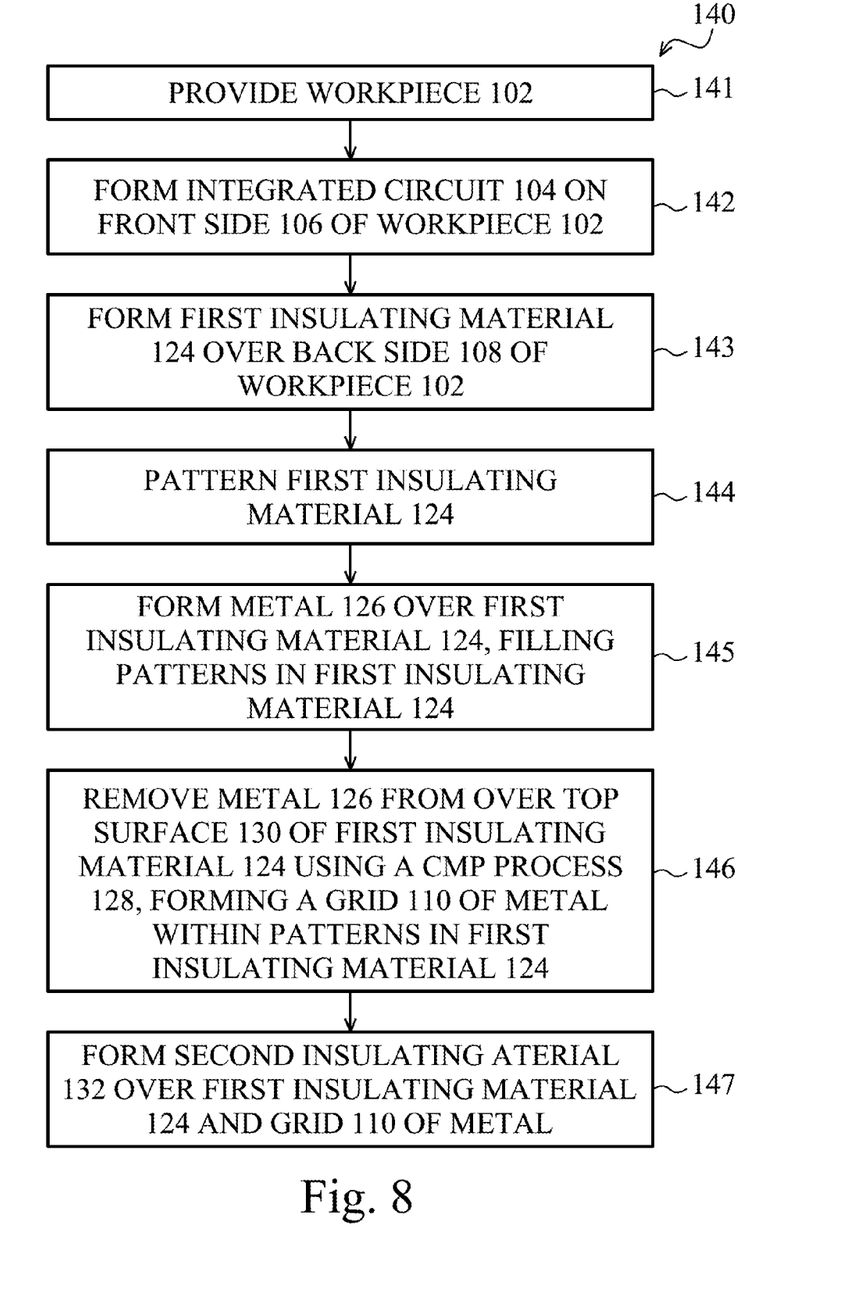
FIG. 8 is a flow chart illustrating a method of forming the metal grid in accordance with an embodiment.

FIG. 8 is a flow chart 140 illustrating a method of forming the metal grid 110 in accordance with an embodiment. In step 141, a workpiece 102 is provided. In step 142, an integrated circuit 104 is formed on the front side 106 of the workpiece 102. Note that step 142 may optionally be performed after step 147, in some embodiments. In step 143, the first insulating material 124 is formed over the back side 108 of the workpiece 102. In step 144, the first insulating material 124 is patterned, and in step 145, the metal 126 is formed over the first insulating material 124, filling the patterns in the first insulating material 124. In step 146, the metal 126 is removed from over the top surface 130 of the first insulating material 124 using a CMP process, forming a grid 110 of the metal 126 within the patterns in the first insulating material 124. In step 147, the second insulating material 132 is formed over the first insulating material 124 and the grid 110 of metal.

Figure 9:
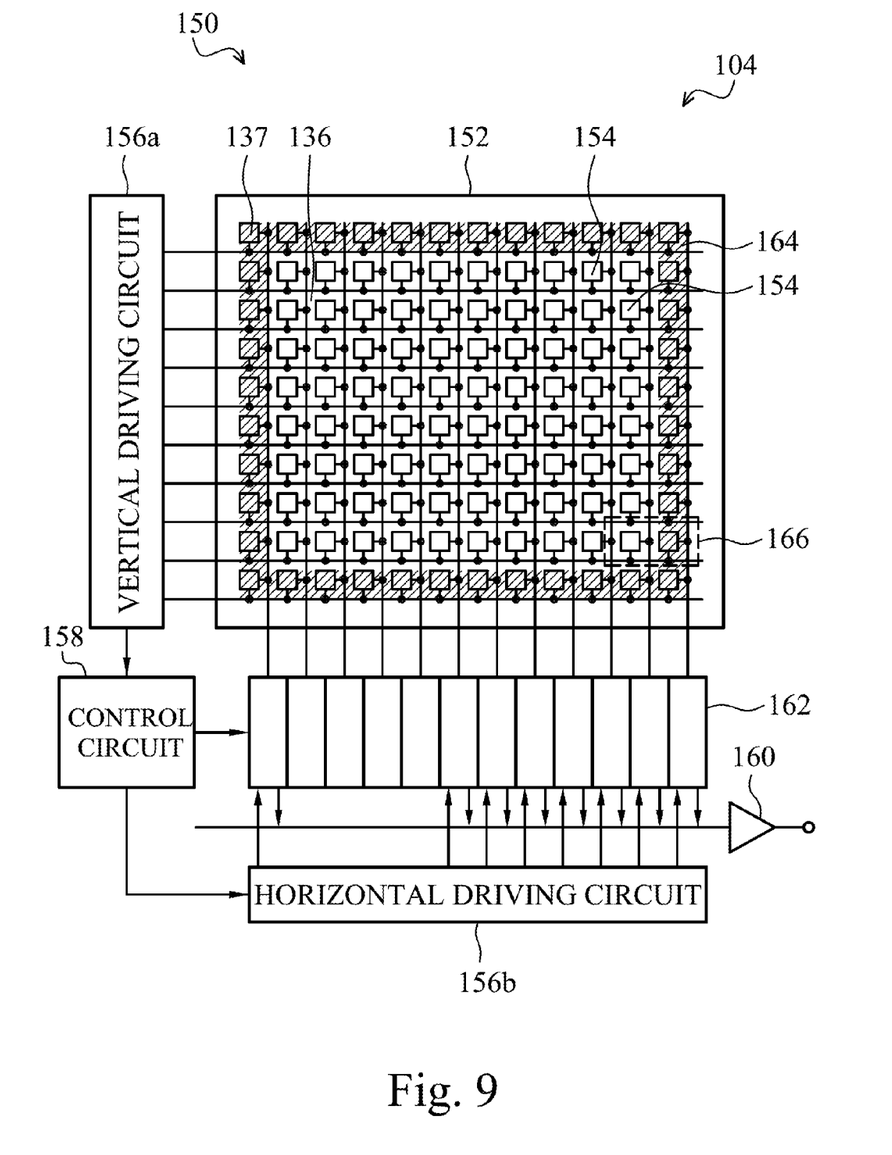
FIG. 9 is a schematic of a BSI sensor in which the metal grid is implemented in accordance with an embodiment.
Figure 10:
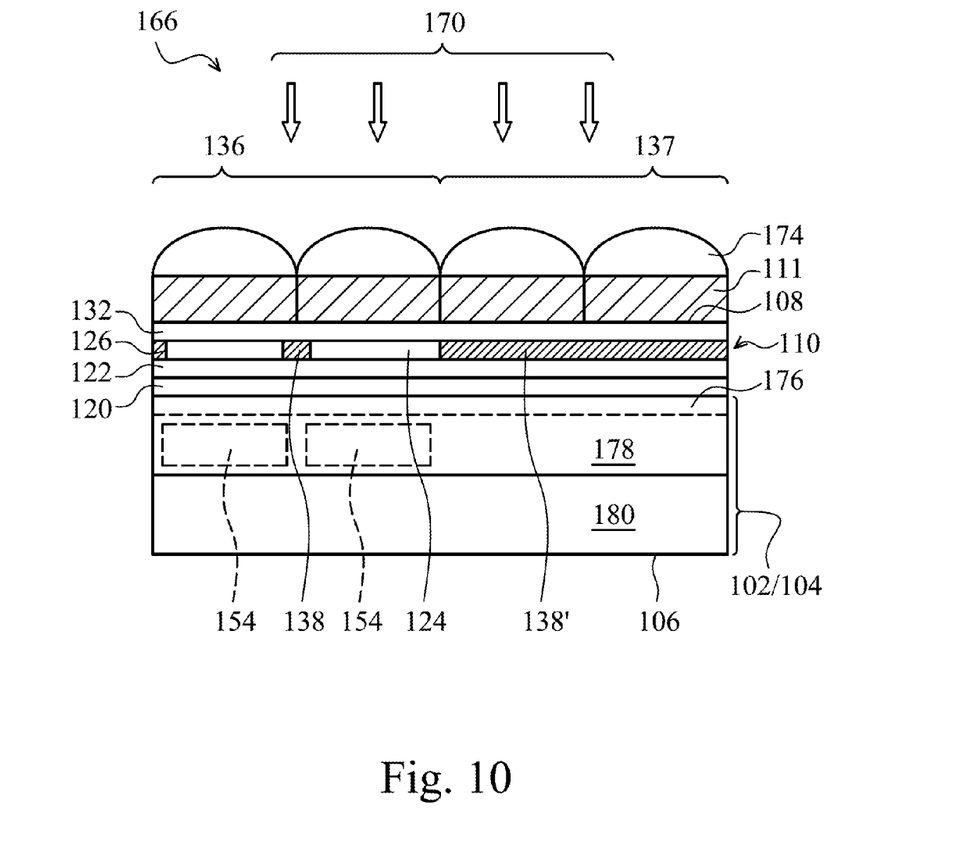
FIG. 10 is a cross-sectional view of a portion of a pixel unit shown in FIG. 9, illustrating the metal grid formed in the BSI sensor.

FIG. 9 is a schematic of a BSI sensor 150 in which the novel metal grid 110 is implemented in accordance with an embodiment. The BSI sensor 150 includes a workpiece 102 (not shown in FIG. 9; see FIG. 10) and a pixel unit 152 comprising an imaging region disposed over the workpiece 102. FIG. 10 is a cross-sectional view of a portion 166 of a pixel unit 152 shown in FIG. 9, illustrating the metal grid 110 formed in the BSI sensor 150. The pixel unit 152 includes a plurality of pixels 154 that include photoelectric conversion elements and are arranged in an array in two dimensions over the workpiece 102. The pixel unit 152 includes a first region 136 that comprises a central effective pixel region and a second region 137 comprising an optical black (OPB) region that is positioned outside the effective pixel region 136 along the perimeter. The second region 137 is shaded with hatching in the schematic shown in FIG. 9. The OPB region 137 detects a black level and may be covered by a light-shielding element or film, such as portions of the grid 110 comprising the wider elements 138' shown in FIG. 10. Alternatively, the light-shielding element or film may be comprised in an additional material layer disposed over the workpiece 102, for example, not shown.

The pixels 154 include photodiodes that function as photoelectric conversion elements and a plurality of pixel transistors comprising metal-oxide semiconductor (MOS) transistors. The transistors may comprise a transfer transistor, a reset transistor, and an amplification transistor, and an optional selection transistor for each pixel 154, as examples.

The BSI sensor 150 includes peripheral circuitry that includes a vertical driving circuit 156a, a horizontal driving circuit 156b, a plurality of column signal processing circuits 162, a control circuit 158, an output circuit 160, and input/output terminals (not shown). The control circuit 158 is adapted to receive an input clock and data for controlling an operation mode. The control circuit 158 also outputs data including internal information of the BSI sensor 150.

The vertical driving circuit 156a receives signals from the control circuit 158, sequentially selectively scans the pixels 154 in the pixel unit 152 in rows in a vertical direction, and supplies pixel signals to the column signal processing circuits 162 based on a signal charge generated in accordance with an amount of received light (see light 170 in FIG. 10) in the photodiodes of the pixels 154.

The column signal processing circuits 162 comprise signal processors that are adapted to remove noise, amplify signals and perform A-D conversions, as examples. The horizontal driving circuit 156*b* is adapted to sequentially select the column signal processing circuits 162 for outputting pixel signals to the output circuit 160. The output circuit 160 may be adapted to perform signal processing on signals received from column signal processing circuits 162, output the signals, and/or perform buffering, black-level adjustment, column variation correction, and various other digital signal processes, as examples, depending on the design of the BSI sensor 150. Alternatively, the BSI sensor 150 may be arranged in other configurations and the peripheral circuitry may be adapted to perform other functions.

In some embodiments, the grid 110 is formed in a central region of the integrated circuit 104 proximate the pixels 154 in region 136, but the grid 110 is not formed in region 137 (not shown). In other embodiments, the elements 138 of the grid 110 have a reduced width in region 136 and the elements 138' of the grid 110 have an increased width in region 137, as shown in the cross-sectional view in FIG. 10. The elements 138 may comprise substantially the entire width of region 137 in some embodiments, to block out the light 170 in the OPB region 137, for example. This embodiment is advantageous because an additional material layer is avoided in the structure for blocking the light 170.

FIG. 10 is a cross-sectional view illustrating various additional material layers of a portion 166 of the BSI sensor 150. A film 111 comprising a color filter is disposed over the insulating material 132. The color filter 111 comprises a color filter material that is adapted to separate color components of the light 170 into different colors; e.g., green (G), red (R), and blue (B). A lens material 174 is formed over the color filter material 111. The workpiece 102/integrated circuit 104 of the BSI sensor 150 includes an optional p-type semiconductor region 176 disposed proximate the back side 108, e.g., proximate the insulating material 120 or 122, as shown in phantom. The p-type semiconductor region 176 is adapted to suppress dark current. A photodiode region 178 is disposed proximate the p-type semiconductor region 176. The photodiode region 178 includes photodiodes of the pixels 154 and transistors for selecting and addressing the pixels, not shown. A wiring layer 180 is disposed proximate the photodiode region 178 proximate the front side 106. The wiring layer 180 comprises multiple layers of conductive lines and vias disposed in multiple insulating layers, not shown.

The members 138 of the metal grid 110 in the first region 136 are disposed over edges of the pixels 154 in the pixel region 178 in some embodiments. For example, two pixels 154 are shown in the first region 136, and the members 138 in the metal grid 110 are disposed over the edges of each of the two pixels 154.

In operation of the BSI sensor 150, incident light 170 enters from the back side 108 and is bent by the lenses formed by the lens material 174 to be focused onto the photodiodes in the photodiode layer 178, after color components of light 170 are separated by the color filter material 111. The photodiodes perform photoelectric conversion of the incident light 170, and the circuit in the schematic shown in FIG. 9 is used to produce and output an image received.

Advantages of embodiments of the disclosure include providing novel metal grids 110 on the back side 108 of wafers or workpieces 102 for improved uniformity control of subsequently formed material layers on the back side 108. The methods and structures are implementable on back sides of silicon wafers in very large scale integration (VLSI) semiconductor devices. Wafer-to-wafer (WTW) uniformity and within-wafer (WIW) uniformity of subsequently formed material layers are significantly improved by the use of novel damascene-formed metal grids 110. A uniform coating of the insulating material 132 and/or optionally a cap color photoresist film 111 on the workpiece 102 back side 108 provided by embodiments of the present disclosure achieves uniform light 170 or energy absorption across the back side 108 of the workpiece 102 in some applications, advantageously. The novel metal grid 110 improves color filter thickness performance, e.g., of an optional cap color photoresist film 111 formed on the back side 108 of the workpiece 102. The WIW and WTW film thickness of the second insulating material 132 and optional cap color photoresist film 111 U % are improved. WIW uniformity of less than about 400 Angstroms can be achieved by the use of embodiments described herein, as an example.

The manufacturing methods described herein achieve metal grid 110 CMP process uniformity control and result in a reduction of or elimination of defect voids that may form in the metal grid 110 if an etch back process were to be used rather than the CMP process to form the metal grid 110 described herein. The damascene processes used to form the metal grid 110 result in improved sidewall formation for the grid 110 members 138, 138*a*, 138*b*, and 138' in comparison to a sidewall formation for a subtractive etch process, resulting in improved sidewall adhesion of the grid 110 to the adjacent first insulating material 124. The novel manufacturing methods described herein are easily implementable in manufacturing process flows.

Embodiments of the present disclosure are particularly useful when implemented in BSI sensors 150. The improved uniformity achieved by the damascene methods of forming the metal grids 110 results in reduced reflection of the incident light 170. Performance of the color filter material 111 of BSI sensors 150 is further improved by the increased uniformity of the metal grids 110 and also an increased uniformity of the color filter material 111.

In accordance with one embodiment of the present disclosure, a method of manufacturing a semiconductor device includes providing a workpiece and forming an integrated circuit on a front side of the workpiece. A grid comprising a conductive material is formed on a back side of the workpiece using a damascene process.

In accordance with another embodiment, a method of manufacturing a semiconductor device includes providing a workpiece having a front side and a back side opposite the front side. An integrated circuit is formed on the front side of the workpiece, and an insulating material is formed over the back side of the workpiece. The insulating material is patterned and a conductive material is formed over the patterned insulating material. The conductive material is removed from over a top surface of the patterned insulating material, forming a grid of the conductive material within the patterned insulating material.

In accordance with yet another embodiment, a method of manufacturing a back side illumination (BSI) sensor includes providing a workpiece having a front side and a back side opposite the front side, and forming an integrated circuit comprising an array of back side illumination sensors on the front side of the workpiece. A first insulating material is formed over the back side of the workpiece, and the first insulating material is patterned, forming patterns in the first insulating material. The method includes forming a metal over the first insulating material, filling the patterns in the first insulating material with the metal, and removing the metal from over a top surface of the first insulating material using a CMP process, forming a grid of the metal within the patterns in the first insulating material. A second insulating material is formed over the first insulating material and the grid of the metal. The method includes forming a color filter material over the second insulating material, and forming a lens material over the color filter material.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
   providing a workpiece, the workpiece having a front side and a back side opposite the front side;
   forming a grid comprising a conductive material on the back side of the workpiece using a damascene process, the grid comprising a first region and a second region, the second region located along a perimeter outside of the first region, the first region comprising a grating of first members, wherein each of the first members has a first width, the second region comprising second members, wherein each of the second members has a second width, the second width greater than the first width; and
   after forming the grid, forming an integrated circuit on the front side of the workpiece.

2. The method according to claim 1, wherein forming the grid comprises forming a metal grid.

3. The method according to claim 2, wherein forming the metal grid comprises forming a material selected from the group consisting essentially of W, Al, Cu, and combinations thereof.

4. The method according to claim 1, wherein forming the first region of the grid comprises forming the first members of the conductive material that extend lengthwise in an x direction and a y direction in a bottom view of the workpiece.

5. The method according to claim 4, wherein the first width of the first members is about 130 nm to 300 nm.

6. The method according to claim 4, wherein the first members comprise a thickness in a cross-sectional view of about 3,000 Angstroms or less.

7. The method according to claim 1, wherein forming the grid comprises forming an insulating material over the back side of the workpiece, patterning the insulating material with a plurality of patterns, and filling the plurality of patterns with a conductive material.

8. The method according to claim 7, wherein the insulating material comprises a first insulating material, further comprising forming a second insulating material over the grid and the first insulating material, and wherein forming the grid comprises improving a uniformity of the second insulating material.

9. The method of claim 1, further comprising forming an anti-reflective coating (ARC) over the back side of the workpiece.

10. A method of manufacturing a semiconductor device, the method comprising:
    providing a workpiece, the workpiece having a front side and a back side opposite the front side;
    forming an insulating material over the back side of the workpiece;
    patterning the insulating material;
    forming a conductive material over the patterned insulating material; and
    removing the conductive material from over a top surface of the patterned insulating material, forming a grid of members, the grid of members comprising:
       a first plurality of members comprising the conductive material within the patterned insulating material, each of the first plurality of members having substantially equal first widths; and
       a second plurality of members around a perimeter of the first plurality of members, the second plurality of members comprising the conductive material within the patterned insulating material, each of the second plurality of members having substantially equal second widths, each of the second widths being greater than each of the first widths;
    after forming the grid of members, forming an integrated circuit on the front side of the workpiece; and
    forming a plurality of back side illumination sensors on the front side of the workpiece, the plurality of back side illumination sensors comprising:
       a first set of back side illumination sensors, the first set aligned with the first plurality of members such that at least one back side illumination sensor in the first set is positioned to receive light from the back side of the semiconductor device through spaces in the first plurality of members; and
       a second set of back side illumination sensors, the second set aligned with the second plurality of members such that the second plurality of members blocks light impinging on the back side of the semiconductor device to at least one back side illumination sensor in the second set.

11. The method according to claim 10, wherein patterning the insulating material comprises depositing a layer of photoresist over the insulating material, patterning the layer of photoresist using lithography, using the layer of photoresist as an etch mask while portions of the insulating material are etched away, and removing the layer of photoresist.

12. The method according to claim 10, wherein patterning the insulating material comprises directly patterning the insulating material.

13. The method according to claim 10, wherein forming the insulating material comprises forming an oxide material, further comprising forming a passivation oxide over the grid of members and the oxide material.

14. The method of claim 10, further comprising forming an anti-reflective coating (ARC) over the back side of the workpiece.

15. The method of claim 10, wherein each of the first widths of the first plurality of members is about 130 nm to 300 nm.

16. A method of manufacturing a back side illumination (BSI) sensor, the method comprising:
providing a workpiece having a front side and a back side opposite the front side;
forming a first insulating material over the back side of the workpiece;
patterning the first insulating material, forming patterns in the first insulating material;
forming a metal over the first insulating material, filling the patterns in the first insulating material with the metal;
removing the metal from over a top surface of the first insulating material using a chemical-mechanical polishing (CMP) process, forming a grid of the metal comprising a plurality of intersecting members within the patterns in the first insulating material, the plurality of intersecting members comprising a first region and a second region, the second region comprising a border around the first region, the first region comprising first members having substantially equal first widths, the second region comprising second members having substantially equal second widths, each of the second widths being greater than each of the first widths;
discontinuing removing the metal from over the top surface of the first insulating material when an endpoint is detected;
forming a second insulating material over the first insulating material and the grid of the metal;
forming a color filter material over the second insulating material;
forming a lens material over the color filter material; and
after forming the grid, forming an integrated circuit comprising an array of back side illumination sensors on the front side of the workpiece, the array of back side illumination sensors superimposed from a plan view over substantially the same area as the grid, at least one of the array of back side illumination sensors being entirely within the second region from a plan view.

17. The method according to claim 16, further comprising forming an anti-reflective coating (ARC) over the back side of the workpiece, and forming a third insulating material over the ARC, before forming the first insulating material.

18. The method according to claim 17, wherein forming the third insulating material comprises forming a buffer oxide.

19. The method according to claim 16, wherein detecting the endpoint comprises detecting a component of the first insulating material.

20. The method according to claim 19, wherein detecting the endpoint comprises monitoring a slurry of the CMP process.

* * * * *